US006806167B2

(12) United States Patent
Kuriyama

(10) Patent No.: US 6,806,167 B2
(45) Date of Patent: Oct. 19, 2004

(54) METHOD OF MAKING CHIP-TYPE ELECTRONIC DEVICE PROVIDED WITH TWO-LAYERED ELECTRODE

(75) Inventor: Takahiro Kuriyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/274,294

(22) Filed: Oct. 17, 2002

(65) Prior Publication Data

US 2003/0092250 A1 May 15, 2003

(30) Foreign Application Priority Data

Oct. 18, 2001 (JP) ....................................... 2001-320648

(51) Int. Cl.[7] ............................................. H01L 21/301
(52) U.S. Cl. ........................ 438/460; 438/462; 438/464
(58) Field of Search ................................. 438/460, 462, 438/464, 382; 257/536, 537

(56) References Cited

U.S. PATENT DOCUMENTS 6,153,256 A 11/2000 Kambara et al.
6,242,999 B1 * 6/2001 Nakayama et al. .......... 338/309

FOREIGN PATENT DOCUMENTS

JP 10-321421 * 12/1998 ........... H01C/17/06

* cited by examiner

*Primary Examiner*—Hsien-Ming Lee
(74) *Attorney, Agent, or Firm*—Merchant & Gould P.C.

(57) ABSTRACT

A method of making a chip-type electronic device includes a first through a third process steps. In the first step, a first electrode is formed on an insulating aggregate board. In the second step, a second electrode overlapping the first electrode is formed on the aggregate board. In the third step, the aggregate board is cut along a predetermined cutting line. The first electrode is formed as spaced from the cutting line, whereas the second electrode extends over the cutting line.

5 Claims, 18 Drawing Sheets

METHOD OF MAKING CHIP-TYPE ELECTRONIC DEVICE PROVIDED WITH TWO-LAYERED ELECTRODE

BACKGROUND OF THE INVENTION

1. Field of the Invention

The present invention relates to a method of making a chip-type electronic component for surface-mounting on a printed wiring board. The present invention also relates to a chip-type electronic component obtained by such a method.

2. Description of the Related Art

FIG. 13 illustrates an example of prior art chip-type resistor. The illustrated resistor 21 includes a substrate 22 formed of alumina ceramic material. The substrate 22 has an upper surface 22*a* formed with a pair of first upper electrodes 23. Further, the substrate 22 has side surfaces 22*b* formed with side electrodes 24 and a lower surface 22*c* formed with lower electrodes 25. The upper surface 22*a* of the substrate 22 is provided with a resistor element 26 connecting the first upper electrodes 23 to each other. The resistor element 26 is covered with a first overcoat layer 27. The first overcoat layer 27 is covered with a second overcoat layer 29. On each of the first upper electrodes 23A is formed a second upper electrode 28.

The chip-type resistor 21 is manufactured by the process steps (T1–T12) shown in FIG. 14. First, an aggregate board 11 formed of alumina ceramic material as shown in FIG. 15 is prepared. The aggregate board 11 includes a plurality of rectangular regions 12 defined therein. Each of the regions 12 corresponds to the substrate 22 of one resistor 21 shown in FIG. 13. Reference signs 13 and 14 in FIG. 15 indicate portions (cut regions) to be removed in later cutting the aggregate board 11.

After the aggregate board 11 is prepared, lower electrodes 25 and first upper electrodes 23 made of gold or silver are provided (T1, T2). As shown in FIG. 16, each of the first upper electrodes 23 extends across a cut region 13. Subsequently, as shown in FIG. 17, resistor elements 26 are formed by printing and baking a resistor paste (T3). After each of the resistor elements 26 is covered with an overcoat layer 27 (T4), the resistance is adjusted. Specifically, as shown in FIG. 18, a groove 31 for adjusting the resistance is formed in the resistor element 26 by laser trimming (T5). Cuttings generated by the trimming are removed by washing (T6). Then, as shown in FIG. 19, second overcoat layers 29 are formed on the first overcoat layers 27 (T7). The second overcoat layers 27 partially cover the first upper electrodes 23. Subsequently, as shown in FIG. 20, second upper electrodes 28 are formed to cover the exposed portions of the first upper electrodes 23 (T8). The second upper electrodes 28, which are provided as auxiliary electrodes of the first upper electrodes 23, are formed of a resin material containing silver particles. The second upper electrodes 28 are less malleable than the first upper electrodes 23. Then, in a first dicing step T9, the aggregate board 11 is cut along cutting lines L1 shown in FIG. 21 into intermediate substrates (not shown) in the form of a thin strip. Thereafter, side electrodes 24 are formed on the cut surfaces of the intermediate substrates (T10). The intermediate substrates are cut along cutting lines L2 (See FIG. 21) in a second dicing step T11. Finally, nickel-plating (or solder-plating) is applied to each of the exposed electrodes 24, 25, 28 (T12), thereby providing chip resistors 21 (FIG. 13) as products.

Although the above-described manufacturing method has good manufacturing efficiency because a plurality of chip resistors can be obtained from a single aggregate board, it has the following problems.

As described above, the first dicing of the aggregate board 11 is performed in the process step T9. At that time, the first upper electrodes 23 which is relatively malleable may be stretched upward due to their contact with a dicing blade. In such a case, as shown in FIG. 22, the second upper electrodes 28 formed on the first upper electrodes 23 project upward beyond the upper surface of the second overcoat layer 29. Such rising of the electrodes is undesirable because it causes various disadvantages. For example, in packaging the resistor 21, the projecting portion of the second upper electrode 28 may come into contact with a taping apparatus, causing loss of the plating layer formed on the projecting portion. Further, due to the upward projecting of the second upper electrode 28, the electrode 28 may not be properly connected to the side electrode 24.

SUMMARY OF THE INVENTION

An object of the present invention, which is conceived under the circumstances described above, is to provide a method of making a chip-type electronic device without rising an electrode.

According to a first aspect of the present invention, there is provided a method of making a chip-type electronic device. Firstly, in this method, a first electrode is formed on an aggregate board. Then, a second electrode overlapping the first electrode is formed. Finally, the aggregate board is cut along a predetermined cutting line. The first electrode is formed as spaced from the cutting line.

Preferably, the aggregate board includes a cut region to be removed in the cutting step, and the second electrode extends over the cut region.

Preferably, the method of the present invention further includes the step of forming a conductive element for connection to the first electrode on the aggregate board. The second electrode is so formed as to overlap both the first electrode and the conductive element.

Preferably, the second electrode is less malleable than the first electrode.

Preferably, the conductive element is a resistor layer. In this case, the method of the present invention further includes the step of adjusting resistance by forming a trimming groove in the resistor layer, and the resistance adjusting step is performed after the second electrode forming step.

According to a second aspect of the present invention, there is provided a chip-type electronic device. The electronic device is manufactured by the above-described manufacturing method.

Other objects, features and advantages of the present invention will become clearer from the description of the preferred embodiment given below.

BRIEF DESCRIPTION OF THE DRAWINGS

FIG. 3A shows a first upper electrode forming step of the manufacturing method of the present invention, while

FIG. 4A shows a resistor element forming step of the manufacturing method of the present invention, while

FIG. 5A shows a second upper electrode forming step of the manufacturing method of the present invention, while

DETAILED DESCRIPTION OF THE PREFERRED EMBODIMENTS

Preferred embodiments of the present invention will be described below in detail with reference to the accompanying drawings.

Figure 1:
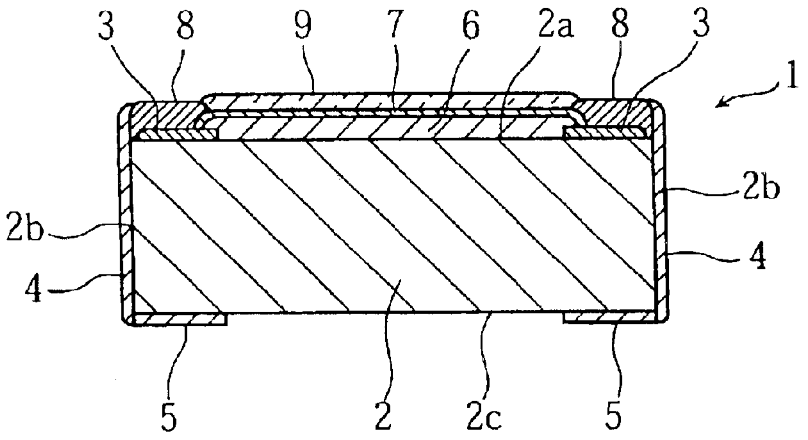
FIG. 1 is a sectional view illustrating the structure of a chip-type resistor manufactured by a method according to the present invention.

FIG. 1 illustrates the basic structure of a chip-type resistor provided by a manufacturing method according to the present invention. The chip-type resistor 1 includes a substrate 2 formed of alumina ceramic material and a pair of first upper electrodes 3 formed on the upper surface 2*a* of the substrate 2. The first upper electrodes 3 may be made of gold or silver, for example, and have a thickness of about 7–15 μm. The substrate 2 has opposite side surfaces 2*b* formed with side electrodes 4 made of gold or silver. The substrate 2 has a lower surface 2*c* formed with lower electrodes 5 connected to the side electrodes 4.

The upper surface 2*a* of the substrate 2 is formed with a resistor element 6 extending to bridge the paired first upper electrodes 3. Though not illustrated, the resistor element 6 includes a groove formed by laser trimming to realize a predetermined resistance.

The resistor element 6 has an upper surface formed with a first overcoat layer 7. The first overcoat layer 7, which may be made of glass for example, is provided to protect the obverse surface of the resistor element 6 in the above-described trimming.

The first upper electrodes 3 have upper surfaces formed with second upper electrodes 8. The second upper electrodes 8, which are formed of a conductive resin material containing silver particles, function as auxiliary electrodes for the first upper electrodes 3. The second upper electrodes 8 are electrically connected to the side electrodes 4. Though not illustrated, exposed portions of the electrodes 4, 5, 8 are formed with nickel-plating layers (or solder-plating layers).

The first overcoat layer 7 has an upper surface on which a second overcoat layer 9 is formed to partially cover the second upper electrodes 8. The second overcoat layer 9, which may be made of glass for example, is provided to protect the first overcoat layer 9 after the above-described trimming.

Figure 2:
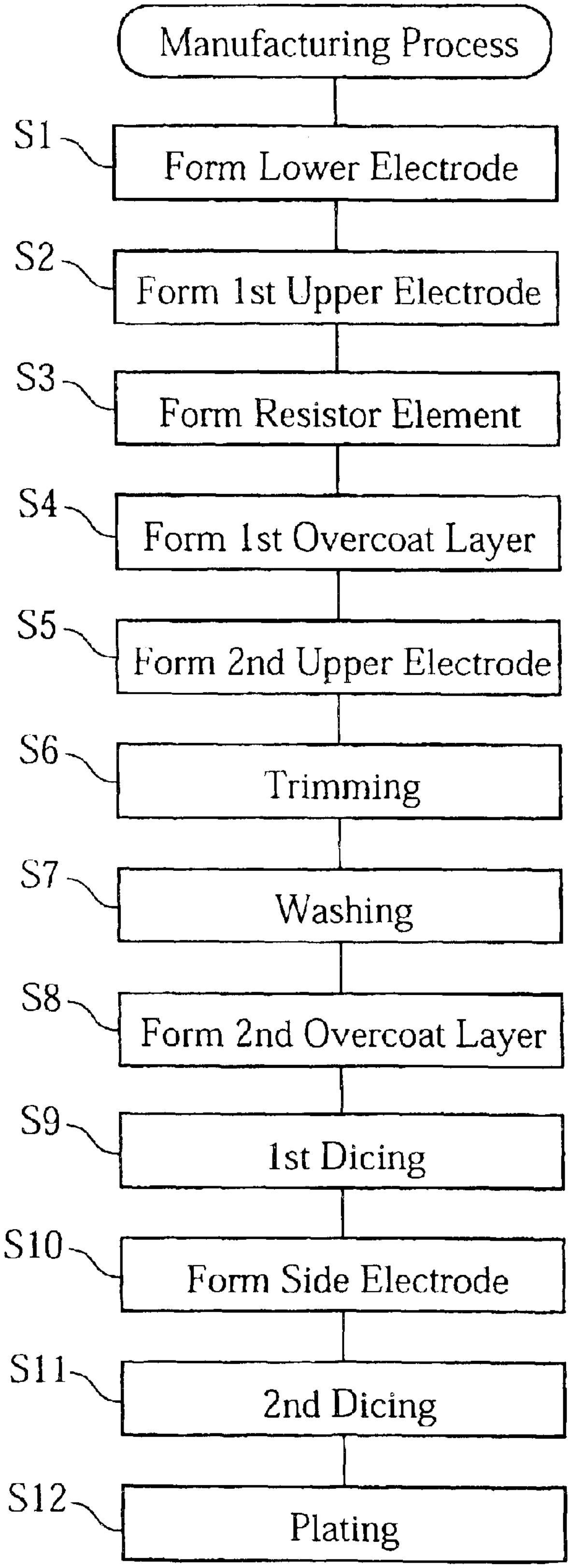
FIG. 2 illustrates the process steps in the manufacturing method of the present invention.
Figure 15:
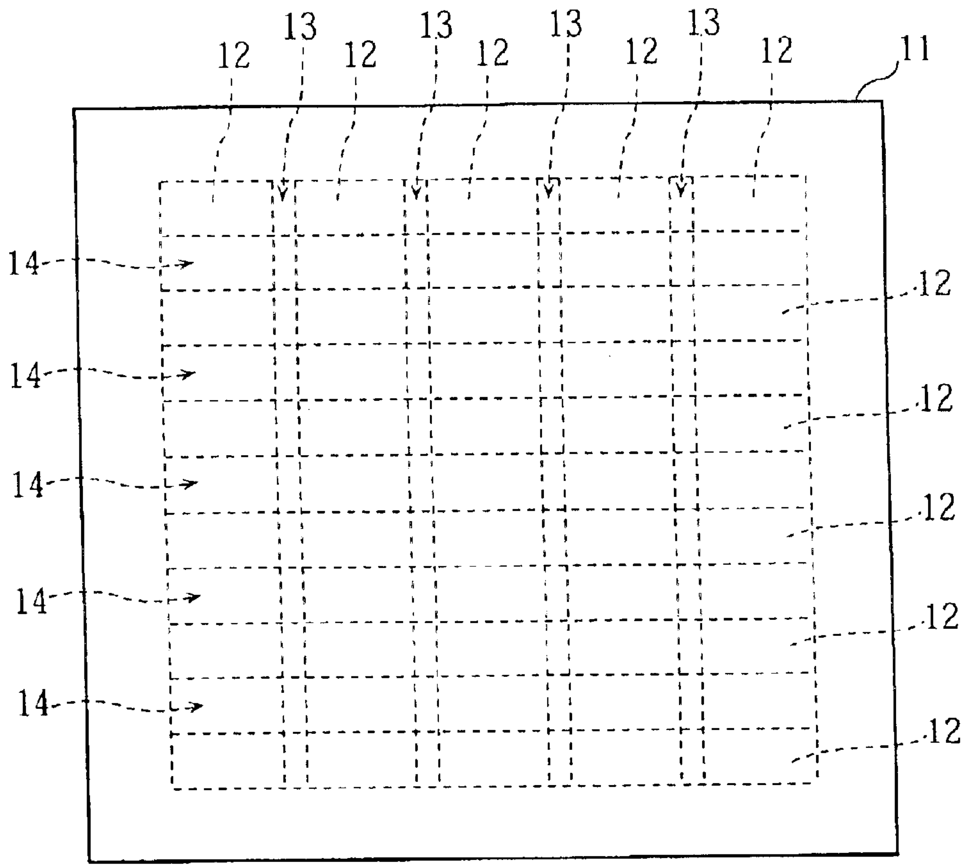
FIG.15 PRIOR ART
FIG. 15 shows an aggregate board used for making the prior-art chip resistors.
Figure 16:
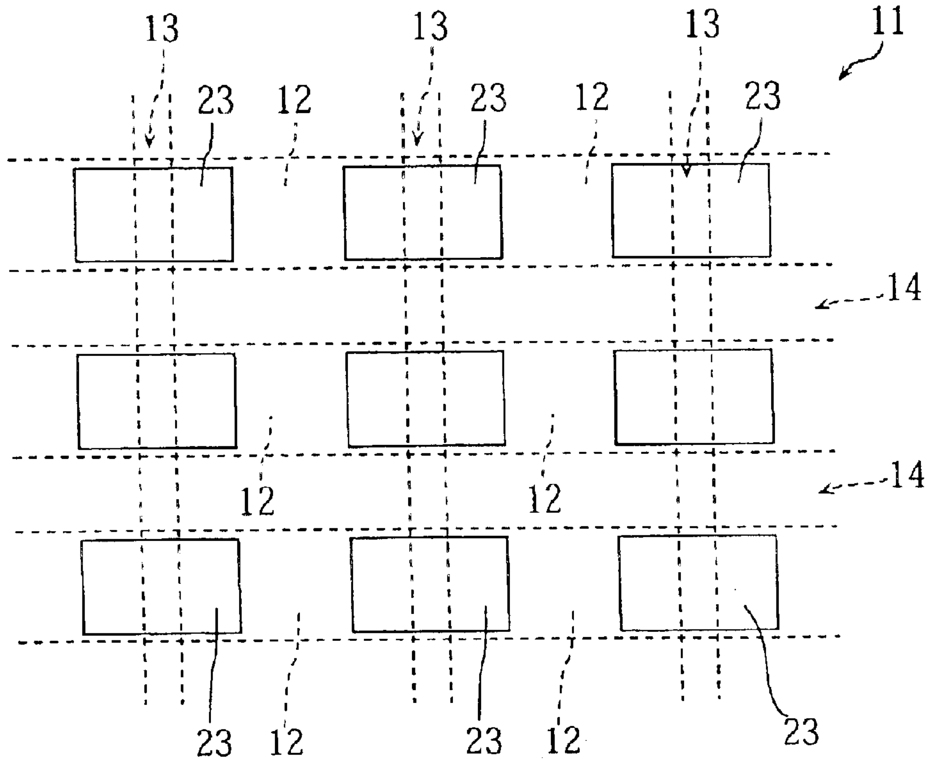
FIG.16 PRIOR ART
FIG. 16 shows first upper electrodes formed on the aggregate board.
Figure 17:
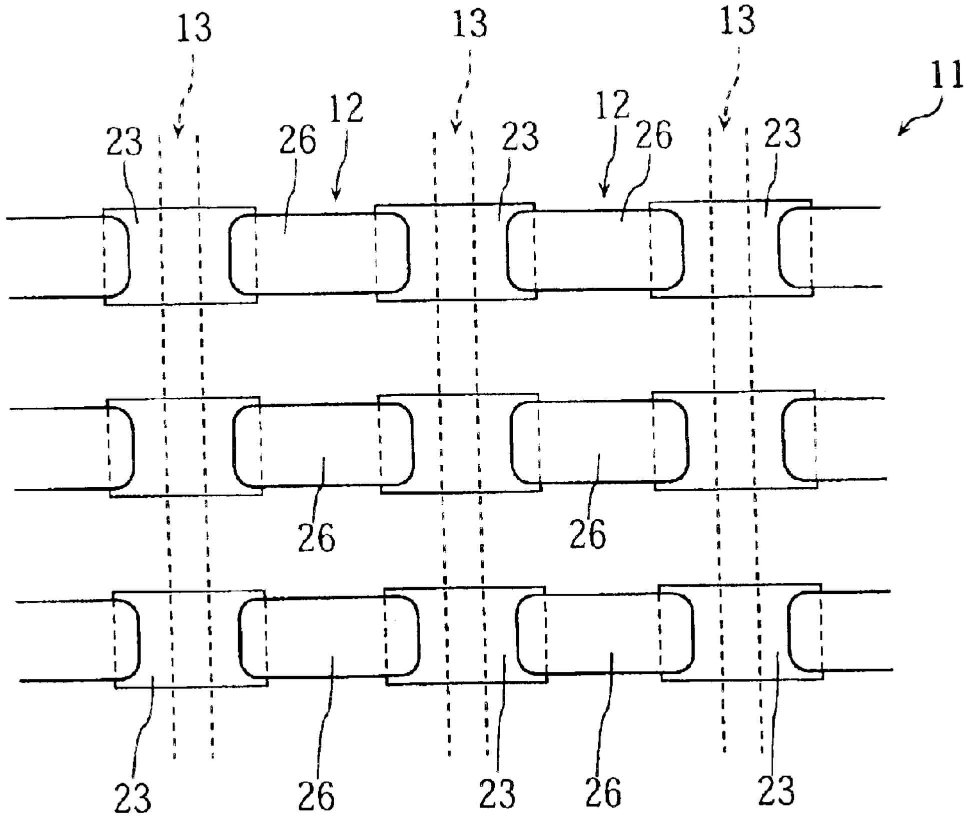
FIG.17 PRIOR ART
FIG. 17 shows resistor elements formed between the first upper electrodes.
Figure 18:
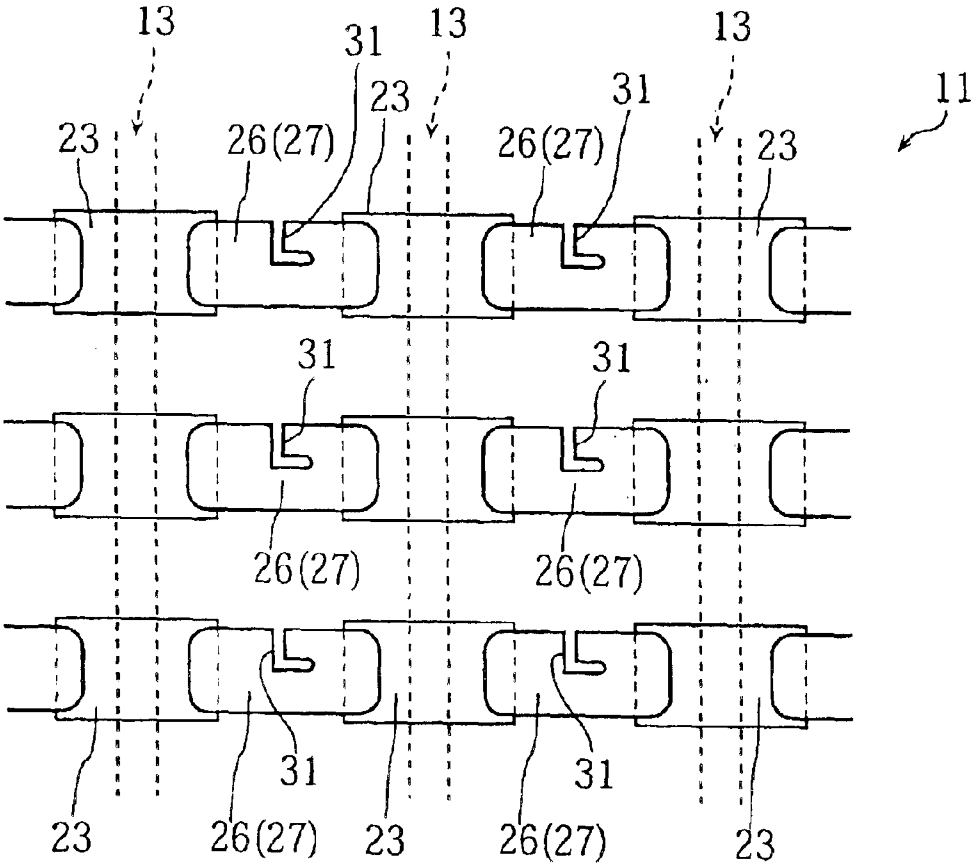
FIG.18 PRIOR ART
FIG. 18 shows trimming grooves formed in the resistor elements.
Figure 19:
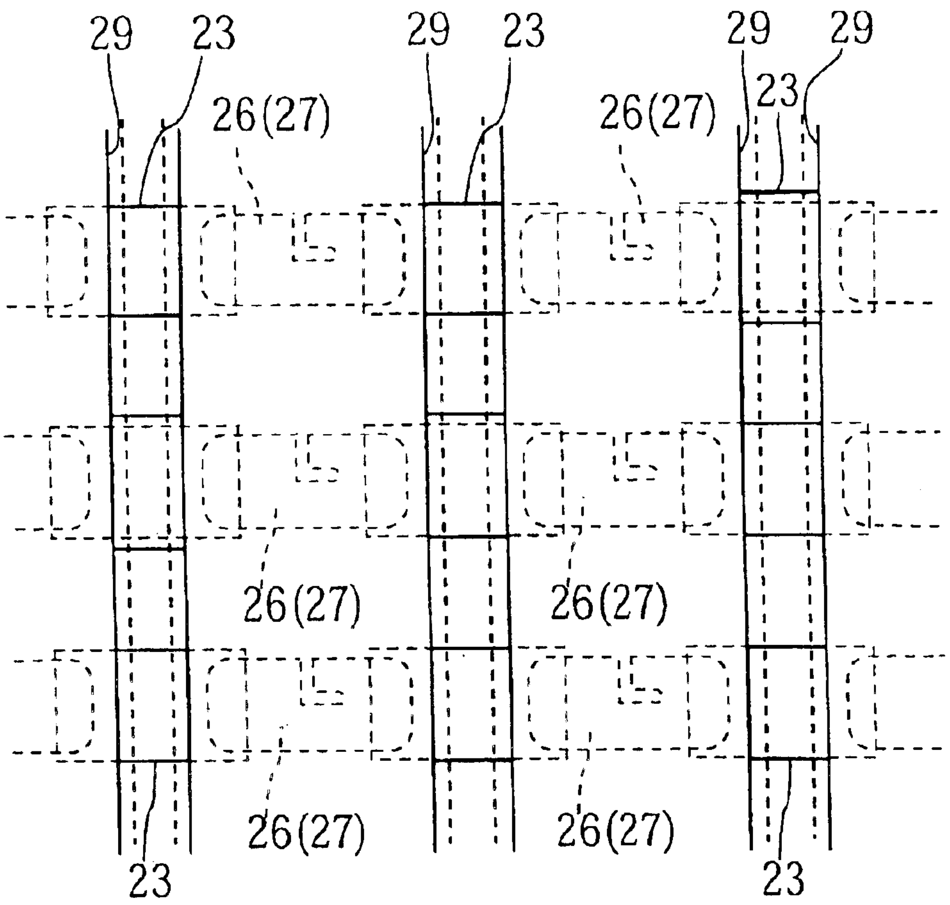
FIG. 19 PRIOR ART
FIG. 19 shows overcoat layers which partially cover the first upper electrodes.
Figure 20:
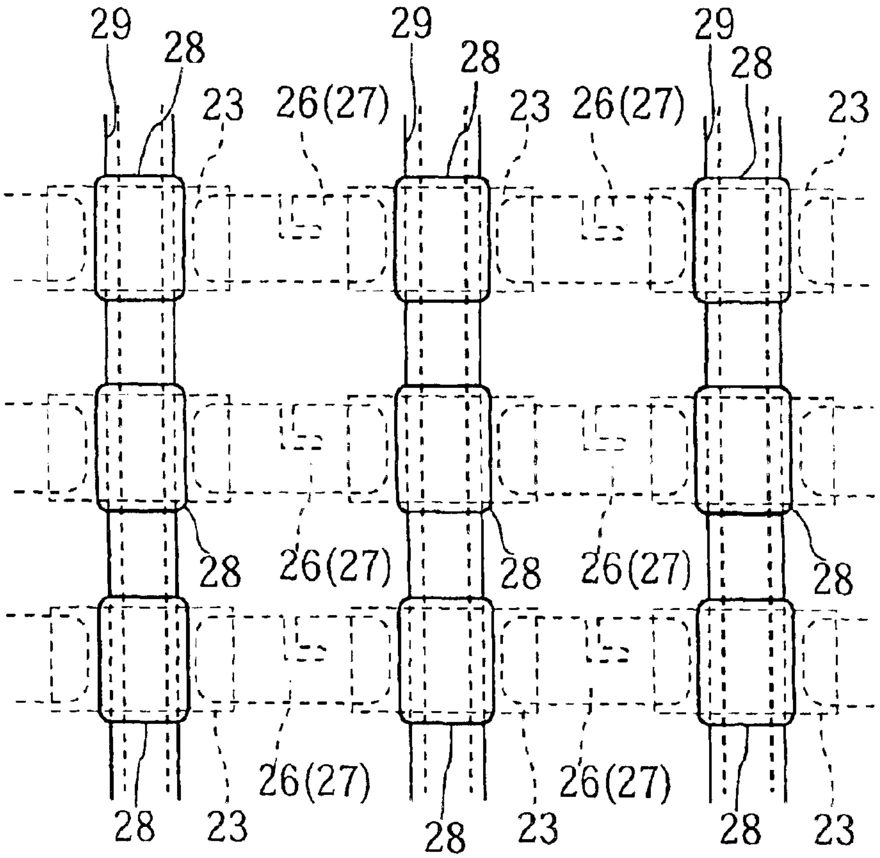
FIG.20 PRIOR ART
FIG. 20 shows second upper electrodes formed to cover the exposed portions of the first upper electrodes.
Figure 21:
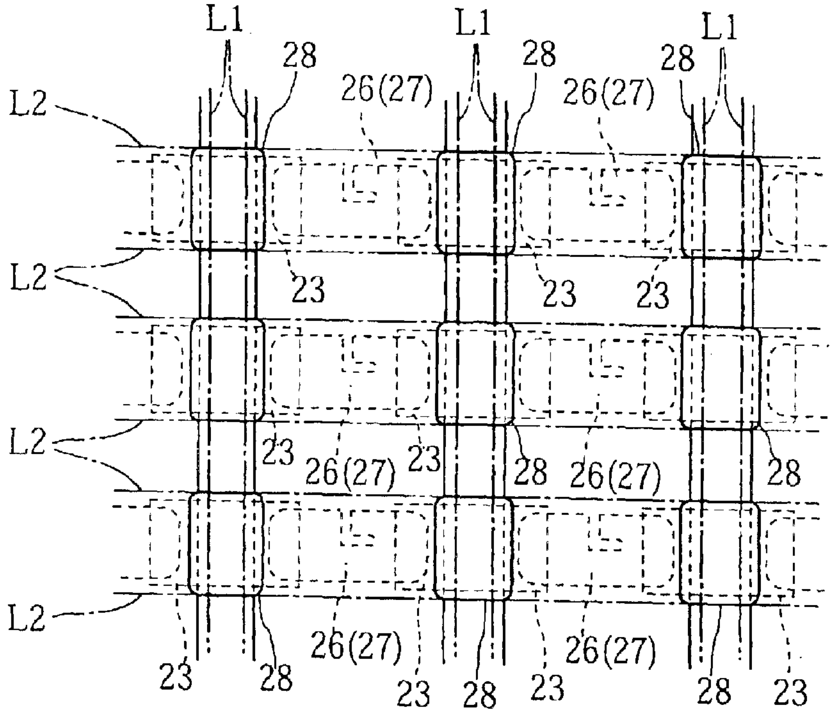
FIG.21 PRIOR ART
FIG. 21 shows cutting lines along which the aggregate board is cut.
Figure 22:
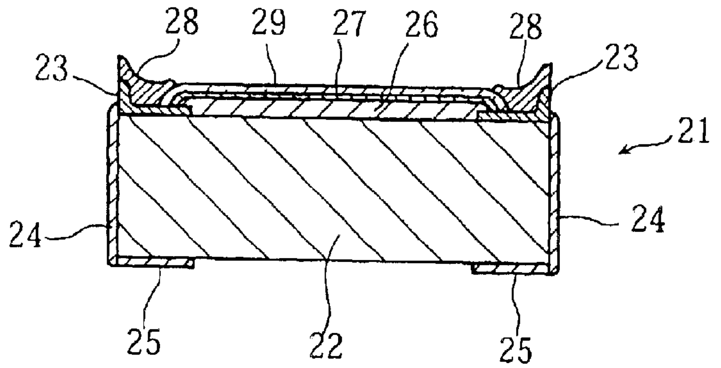
FIG.22 PRIOR ART
FIG. 22 illustrates problems of the prior-art chip resistor.

The chip-type resistor 1 is manufactured by the process steps (S1–S12) shown in FIG. 2. In the manufacturing process, use is made of an aggregate board similar to the prior art one (aggregate board 11 shown in FIG. 15). The aggregate board 11 is formed of alumina ceramic material, for example, and includes a plurality of rectangular regions 12 defined therein. Each of the regions 12 is used to make one chip-type resistor (FIG. 1).

First upper electrodes 3 and lower electrodes 5 are formed on the upper surface and lower surface of the aggregate board 11, respectively (S1, S2). The electrodes 3 and 5 may be formed by screen-printing, for example. Specifically, a conductive paste (obtained by dispersing minute gold or silver particles and glass particles in an organic solvent) is printed at predetermined portions. The printed paste is then dried and baked.

Figure 3A:
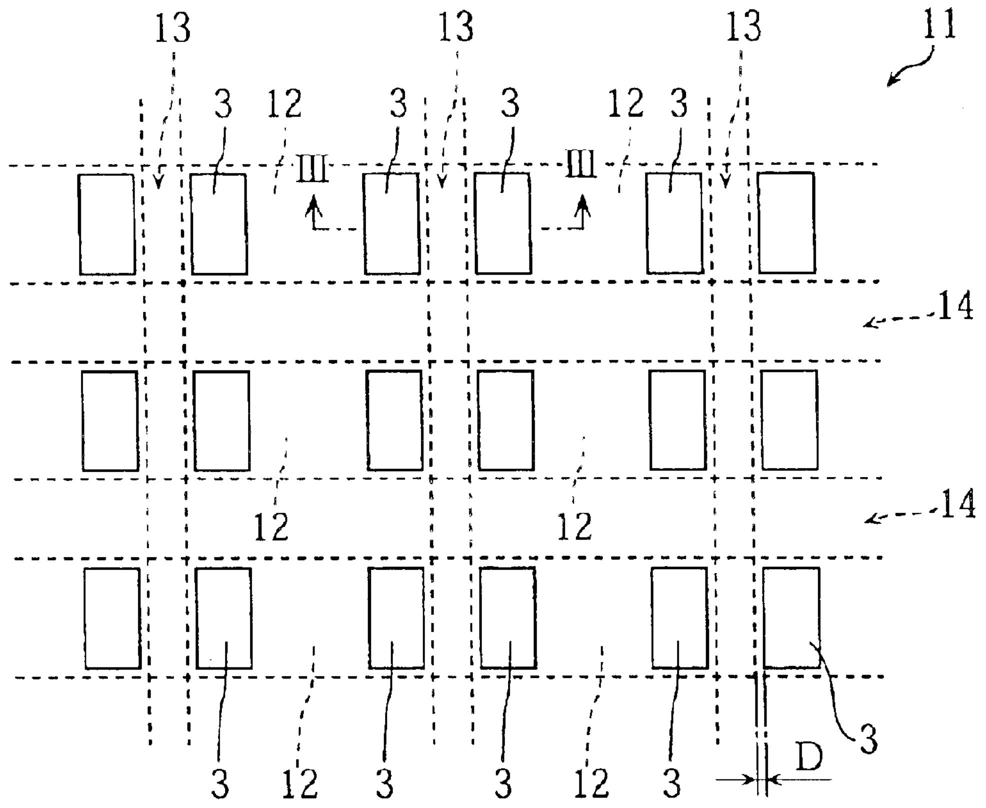
Figure 3B:
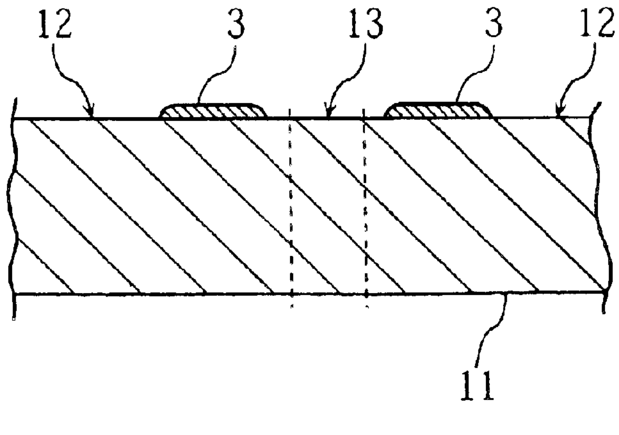
FIG. 3B is a sectional view taken along lines III—III in FIG. 3A.

As shown in FIGS. 3A and 3B, the first upper electrodes 3 are formed adjacent the opposite ends of each rectangular region 12. Unlike the prior art manufacturing method, the first upper electrodes 3 do not extend across the cut regions 13 but spaced from the cut regions 13 by a predetermined distance D.

Figure 4A:
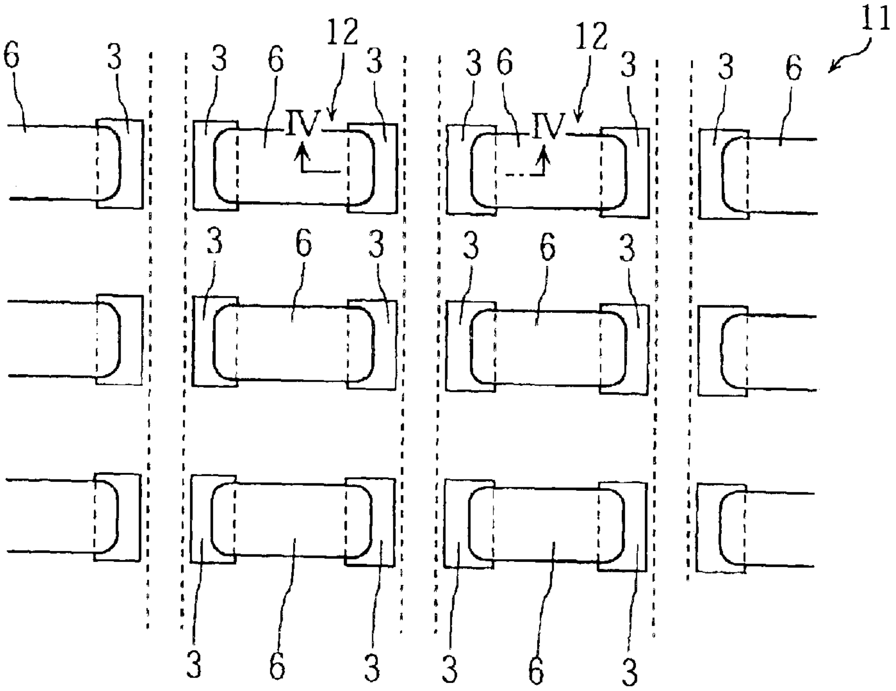
Figure 4B:
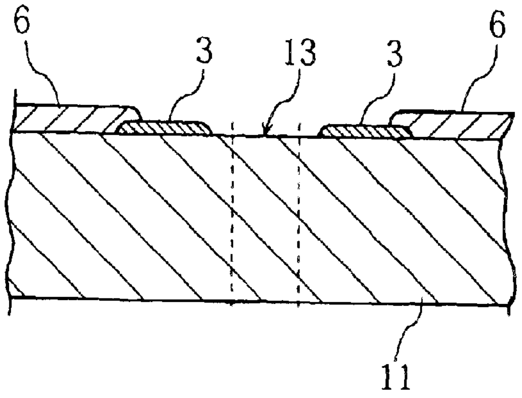
FIG. 4B is a sectional view taken along, lines IV—IV in FIG. 4A.

Subsequently, as shown in FIGS. 4A and 4B, a resistor element 6 is formed in each of the rectangular regions 12 to bridge the paired first upper electrodes 3 (S3). The resistor element 6 may be formed by printing a paste consisting of a conductive substance and glass frit at predetermined portions followed by baking the paste.

Then, a first overcoat layer (not shown) is formed to cover the upper surface of each resistor element 6 (S4). The first overcoat layer 7 is formed by printing and baking an insulating paste containing glass component to have a size generally equal to that of the resistor element 6.

Figure 5A:
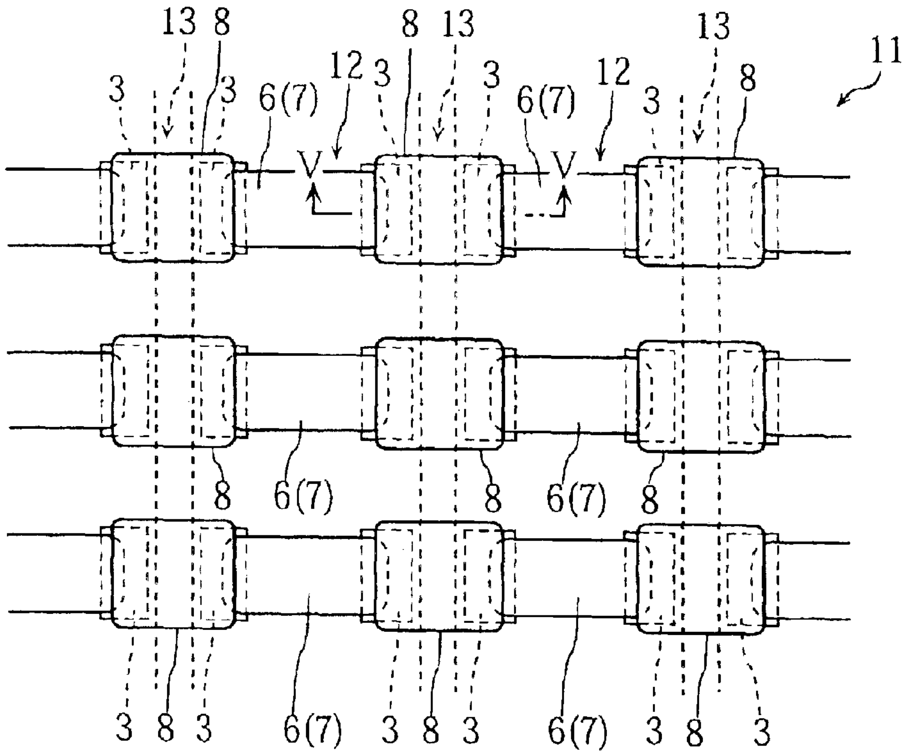
Figure 5B:
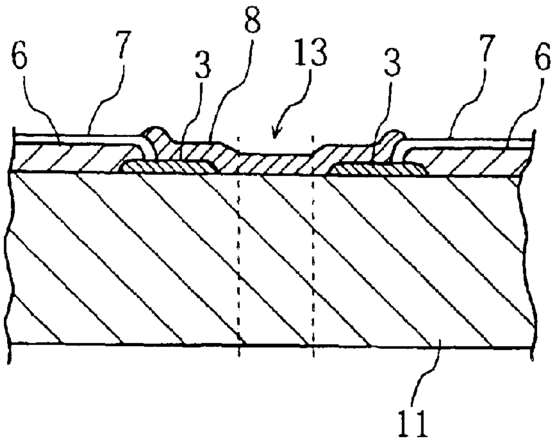
FIG. 5B is a sectional view taken along lines V—V in FIG. 5A.

Subsequently, as shown in FIGS. 5A and 5B, a second upper electrode 8 is formed between two adjacent resistor elements 6 (S5). As will be understood from FIG. 5B, the second upper electrode 8 is so formed as to bridge two first upper electrodes 3 formed in adjacent regions 12. (Therefore, the second upper electrode 8 extends across the cut region 13.) The second upper electrode 8 may also be formed by screen-printing using a conductive silver paste.

Figure 6:
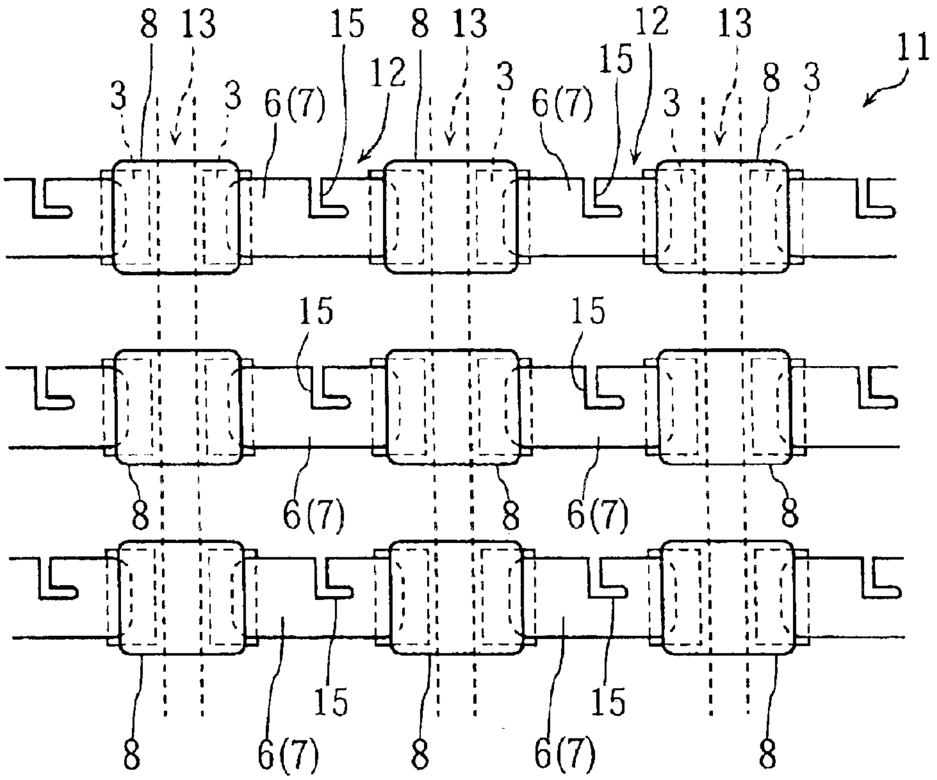
FIG. 6 shows a trimming step of the manufacturing method of the present invention.

After the second upper electrode 8 is formed, trimming for resistance adjustment is performed with respect to each of the resistor elements 6 (S6). As is well known, in the trimming step, a groove is formed while monitoring the change of the resistance in the resistor element 6 using a pair of measurement probes (not shown). In the example shown in FIG. 6, an, L-shaped groove 15 is formed in each of the resistor elements 6. The groove is formed by laser beam machining. At that time, a similar trimming groove is formed also in the first overcoat layer covering the resistor element 6. In this embodiment, the measurement probes are brought into contact with the second upper electrodes 8. As described above, the second upper electrodes 8 extend not only over the first upper electrodes 3 but also over the cut regions 3, so that the measurement probes can easily be brought into contact.

Figure 7:
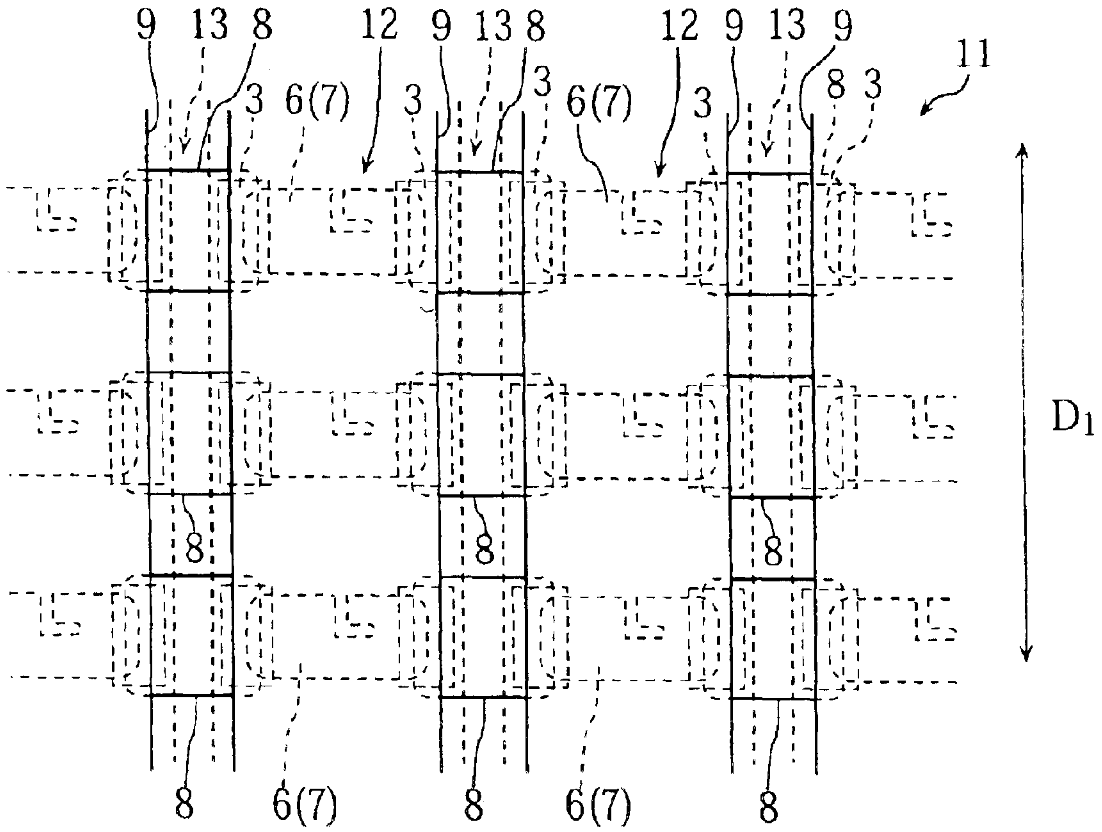
FIG. 7 shows an overcoat layer forming step of the manufacturing method of the present invention.

After the trimming, the aggregate board 11 is entirely washed to remove cuttings generated by the trimming (S7). Then, as shown in FIG. 7, a plurality of second overcoat layers 9 are formed (S8). Each of the second overcoat layers 9 is elongate in the direction $D_1$ of the aggregate board 11 to cover the upper surfaces of the first overcoat layers 7 aligned in the $D_1$ direction and portions of the second upper electrodes 8. The second overcoat layer 9 may be formed by printing an insulating paste by screen-printing followed by baking (or solidifying) the paste.

Figure 8:
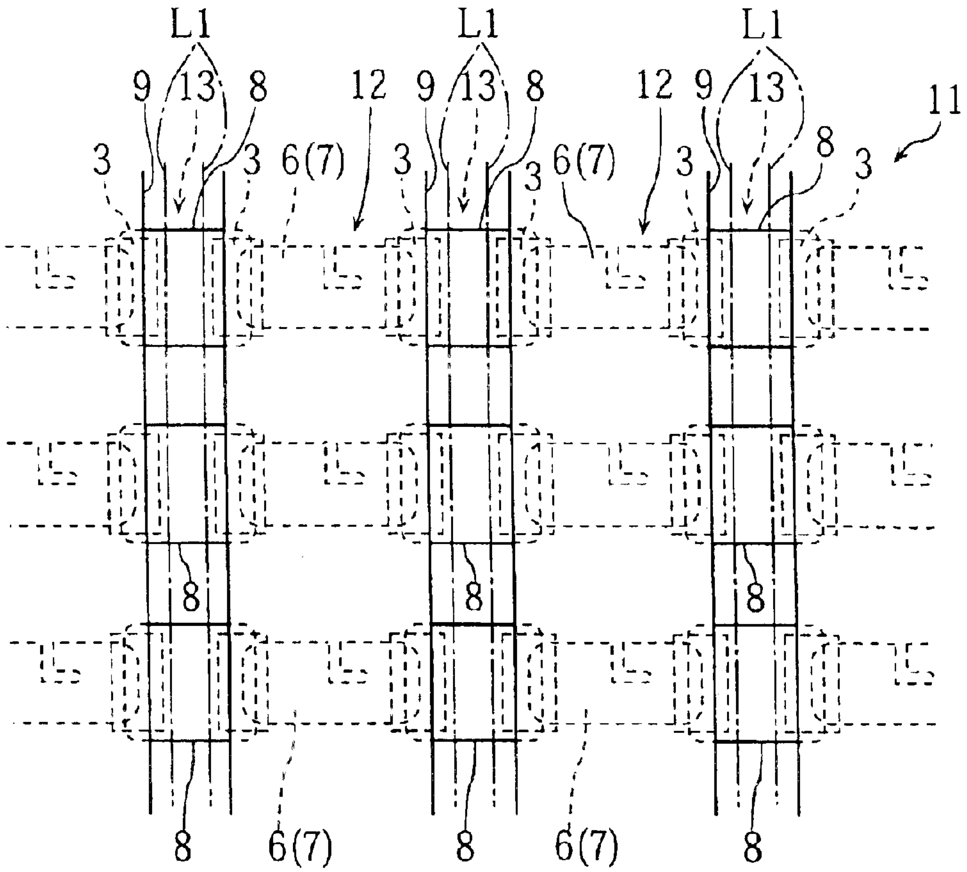
FIG. 8 show a first board cutting step of the manufacturing method of the present invention.
Figure 9:
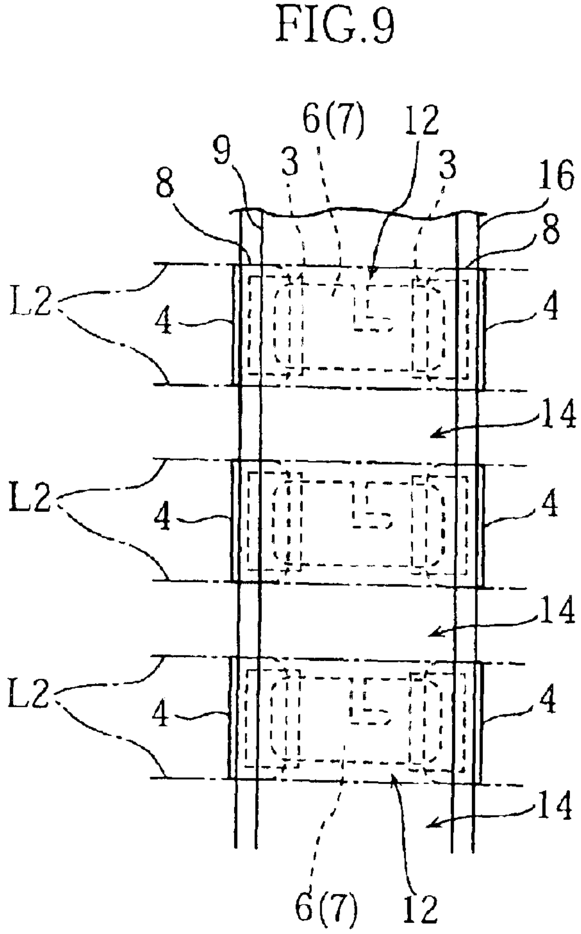
FIG. 9 shows an intermediate product obtained by the first board cutting step.
Figure 10:
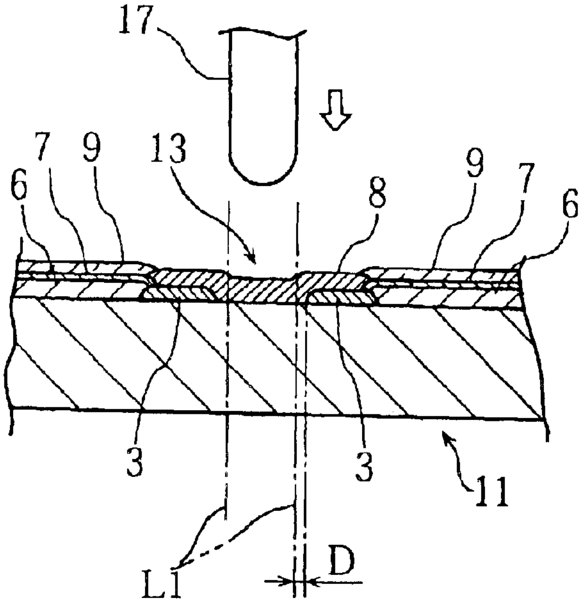
FIG. 10 shows how the board cutting is performed with the use of a circular cutting blade.
Figure 11:
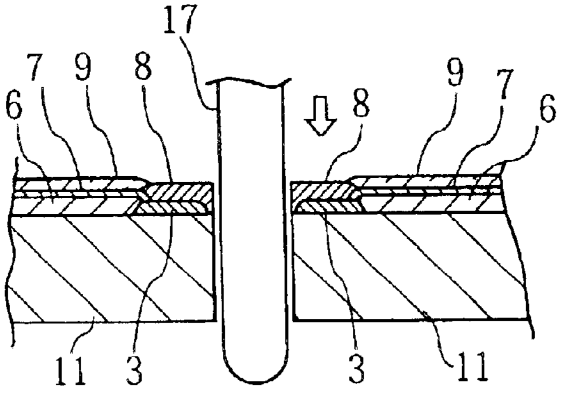
FIG. 11 shows the cutting blade penetrating the board.

Subsequently, the aggregate board 11 is cut along cutting lines L1 shown in FIG. 8 (first dicing step S9). As a result, an intermediate product as shown in FIG. 9 is obtained. The cutting is performed using a circular blade 17 which is driven for rotation (See FIGS. 10 and 11). The blade 17 may be about 0.1 mm in width and about 50 mm in diameter, for example. As described above, the first electrodes 3 are spaced from the cut regions 13 by a predetermined distance D. Therefore, although the blade 17 comes into contact with the second upper electrodes 8, it does not come into contact with the first upper electrodes 3 (FIG. 11). With such a structure, it is possible to prevent the rising of the first upper electrodes, which has been a problem of the prior art manufacturing method. As described above, the second upper electrodes 8 of the present invention are formed of a resin material containing silver particles and therefore relatively less malleable. Therefore, the second upper electrodes 8 are not unduly stretched upward even in contacting the blade 17.

Figure 12:
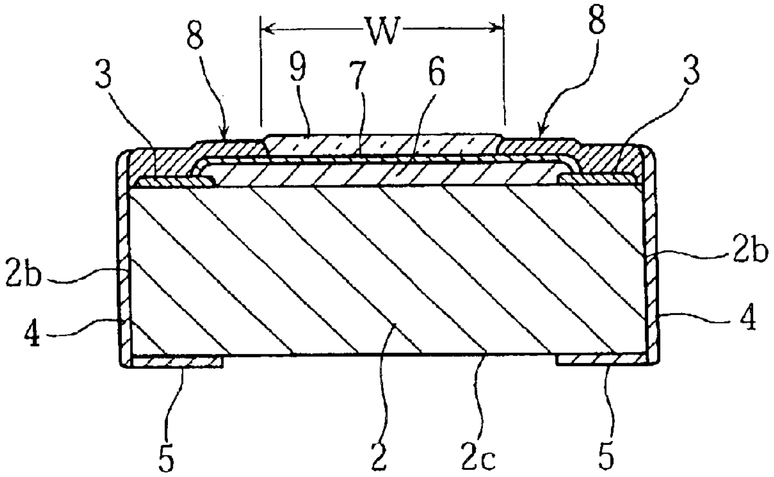
FIG. 12 illustrates a modification of the structure shown in FIG. 1.
Figure 13:
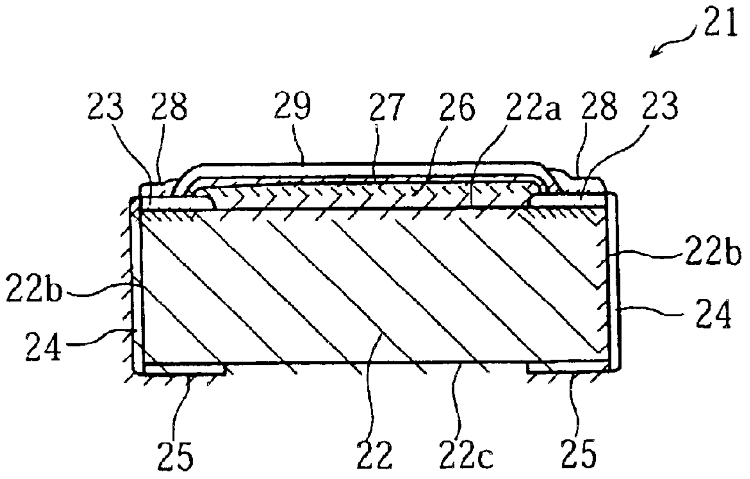
FIG.13 PRIOR ART
FIG. 13 is a sectional view illustrating the structure of a prior-art chip resistor.
Figure 14:
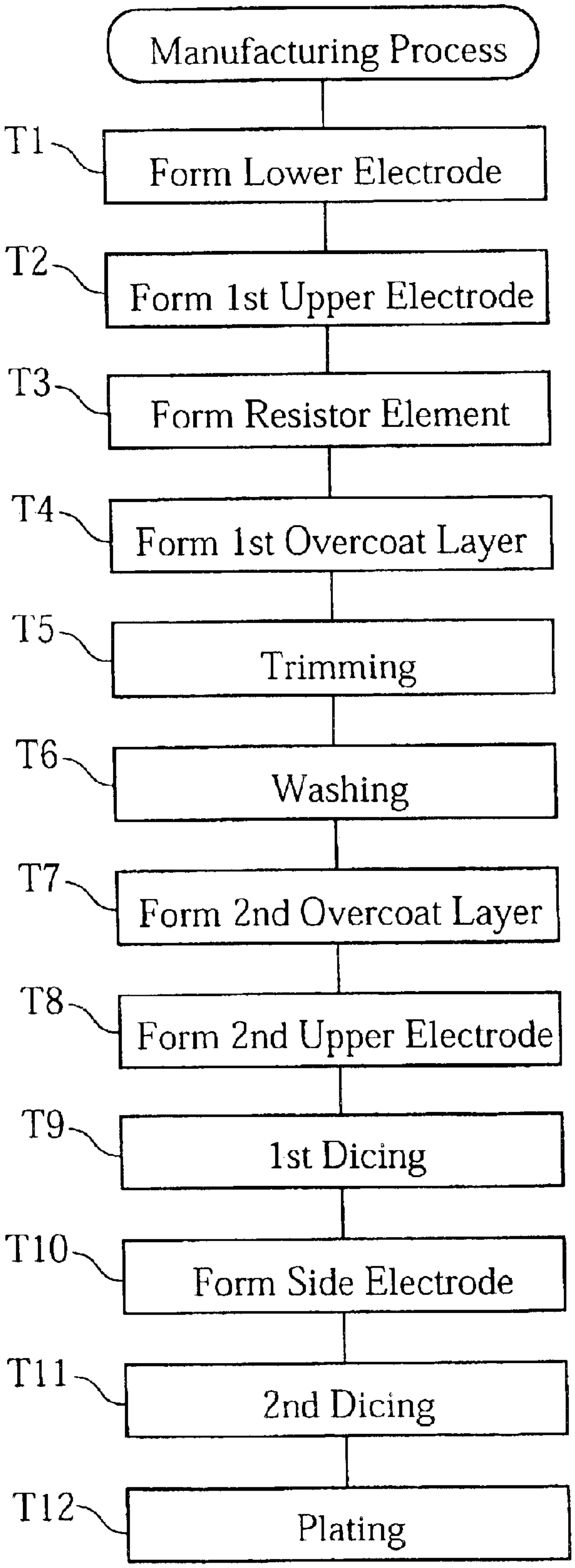
FIG.14 PRIOR ART
FIG. 14 illustrates the manufacturing process steps of the chip resistor shown in FIG. 13.

Subsequent to the first dicing step, side electrodes 4 are formed on the cut surfaces of the intermediate product 16 (S10). As shown in FIG. 12, for electrically connecting the side electrodes 4 to the second upper electrodes 8 reliably, it is preferable that the side electrodes 4 are formed to entirely cover the edge surfaces of the second upper electrodes 8.

Subsequently, the intermediate product 16 is cut along the cut lines L2 shown in FIG. 9 (S11). Finally, nickel-plating (or solder-plating) is applied to exposed portions of the second upper electrodes 8, side electrodes 4 and lower electrodes 5 (S12).

FIG. 12 is a sectional view illustrating a modified chip-type resistor. In the figure, the elements which are identical or similar to the elements shown in FIG. 1 are designated by the same reference signs. The structure shown in FIG. 12 is basically similar to that shown in FIG. 1, but differs therefrom in the following point. That is, in the example shown in FIG. 12, the overcoat layer 9 has a length W which is shorter than the length of the resistor element 6. (In the example shown in FIG. 1, these lengths are generally equal.) On the other hand, the second upper electrodes 8 contacting the second overcoat layer 9 are longer than in the example shown in FIG. 1. With such a structure, it is possible to bring the measurement probes into contact with the second upper electrodes 8 more easily in adjusting the resistance of the resistor element 6.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

What is claimed is:

1. A method of making a chip-type electronic device comprising the steps of:

forming a first electrode on an aggregate board;

forming a second electrode overlapping the first electrode; and cutting the aggregate board along a predetermined cutting line;

the first electrode being spaced from the cutting line;

wherein the aggregate board includes a cut region to be removed in the cutting step, the second electrode extending over the cut region, and the second electrode is less malleable than the first electrode.

2. The method according to claim 1, further comprising the step of forming a conductive element for connection to the first electrode on the aggregate board, the second electrode overlapping both the first electrode and the conductive element.

3. The method according to claim 2, wherein the conductive element is a resistor layer.

4. The method according to claim 3, further comprising the step of adjusting resistance by forming a trimming groove in the resistor layer, the resistance adjusting step being performed after the second electrode forming step.

5. A chip-type electronic device manufactured by the method of claim 1.

* * * * *